United States Patent [19] [11] Patent Number: 5,057,769
Edwards [45] Date of Patent: Oct. 15, 1991

[54] AC CURRENT SENSOR

[75] Inventor: Gerald L. Edwards, Seattle, Wash.

[73] Assignee: Sensorlink Corporation, Bellingham, Wash.

[21] Appl. No.: 386,788

[22] Filed: Jul. 27, 1989

[51] Int. Cl.[5] ............................................. G01R 33/00
[52] U.S. Cl. ................................ 324/127; 324/117 R; 324/107; 336/174
[58] Field of Search ................... 324/127, 117 R, 107; 336/174-176

[56] References Cited

U.S. PATENT DOCUMENTS

| 3,114,880 | 12/1963 | Medlar | 324/127 |
|---|---|---|---|
| 3,146,417 | 8/1964 | Pearson | 336/174 |
| 3,434,052 | 3/1969 | Fechamt | 324/127 |
| 3,497,793 | 2/1970 | Gasparini et al. | 324/127 |
| 3,885,213 | 5/1975 | Rioux et al. | 324/127 |
| 4,482,862 | 11/1984 | Leehey | 324/117 R |
| 4,513,274 | 4/1985 | Halder | 336/174 |
| 4,839,600 | 6/1989 | Kuurstra | 324/117 R |
| 4,935,693 | 6/1990 | Falkowski et al. | 324/117 R |

OTHER PUBLICATIONS

Universal Ammeter Holder (Universal Chuck Adapter); p. F-9 from 1985 Hastings Fiber Glass Products, Inc., Catalog, 12/85.

Primary Examiner—Kenneth Wieder
Assistant Examiner—William J. Burns
Attorney, Agent, or Firm—Gregory W. Moravan

[57] ABSTRACT

An AC current sensor comprising a generally C-shaped main coil with a fixed gap between its ends. A pair of compensating coils are positioned at fixed locations in the main coil's gap. The longitudinal axes of the compensating coils lie on an imaginary straight line which extends between the centers of the main coil's ends; and their electrical centers are each spaced the same distance from their respective ends of the main coil. A compensating coil gap is defined between the electrical centers of the compensating coils. The main coil defines a measuring recess in which the sensed AC current carrying conductor is located when a measurement is taken. When the ratio of the size of the main coil gap to the size of the compensating coil gap is equal to the square root of three, the AC current sensor's accuracy and outside signal rejection increase most rapidly with increased distance of the sensed AC current carrying conductor from the compensating coil gap, and the AC current sensor's size can be minimized. The main coil and the compensating coils are connected to a suitable amplifier and meter display.

35 Claims, 3 Drawing Sheets

AC CURRENT SENSOR

BACKGROUND OF THE INVENTION

The present invention relates to alternating current (AC) sensors which are adapted to measure the AC current in a conductor without breaking or cutting the conductor. More particularly it relates to such an AC current sensor in which the main coil has a fixed gap between its ends. The gap in the main coil is compensated for by a pair of compensating coils located in the fixed gap.

SUMMARY OF THE INVENTION

It is often desirable to be able to measure the AC current in a conductor without cutting or breaking the conductor. One type of conventional apparatus for making such a measurement is a clamp-on AC current sensor which comprises an AC current meter connected to a magnetic core type current transformer. The current transformer's magnetic core is constructed with one or more moveable parts. This enables its magnetic core to be broken open and then closed around the conductor whose current is being measured, so that its magnetic core will completely encircle the conductor. One of the drawbacks of such clamp-on AC current sensors is that in order to work properly, it must have a mechanism for opening its magnetic core and then closing it again with accurate registration in order to minimize air gaps in its magnetic core. Another drawback of such clamp-on AC current sensors is that often its magnetic core is relatively fragile, and thus may be broken relatively easily, such as when it is made of ferrite.

Thus, one of the objects of the present invention is to provide an AC current sensor which does not suffer from the above drawbacks of a clamp-on AC current sensor, but which will still accurately measure the current in a conductor without cutting or breaking the conductor. This is done by providing an AC current sensor whose sensing portion has no moving parts, since it comprises a precise fixed arrangement of a generally C-shaped main coil, a fixed gap in the main coil, and a pair of compensating coils positioned at fixed locations in the main coil's gap. The coils are connected to a suitable amplifier and meter display.

The coils are constructed and arranged so that the voltage which is induced in them by an AC current carrying conductor which is located outside the arrangement is minimized; while the voltage which is induced in them by a sensed AC current carrying conductor which is located inside the arrangement is accurately proportional to the conductor's current.

In general, when the ratio of the size of the gap between the centers of the main coil's ends and the size of the gap between the electrical centers of the compensating coils is equal to the square root of 3, the measurement accuracy and outside signal rejection of the AC current sensor of the present invention increases most rapidly as the distance between the sensed AC current carrying conductor and the gap between the compensating coils increases, and the size of the AC current sensor of the present invention can be minimized. In general, any desired degree of accuracy for any given current range for the AC current sensor can be achieved by a suitable selection of the coils, of the ratio of said gaps, of the size of the AC current sensor and/or of the characteristics of any amplifying means for the induced voltages in the main and/or compensating coils.

Another object of the present invention is to provide an AC current sensor which is durable, relatively low in cost and relatively easy to manufacture because it has no precision moving parts or core pieces.

A further object of the present invention is to provide an AC current sensor which is especially suitable and easy to use for measuring the current in high voltage AC electrical utility primary circuits, since it can be mounted to the end of a linesman's hotstick and since it has no moving parts which need to closed around the conductor in order to measure the AC current in the conductor.

It should be understood that the foregoing is intended to be a brief, not an exhaustive, summary of the objects, features, advantages and characteristics of the present invention, since these and further objects, features, advantages and characteristics of the present invention will be directly or inherently disclosed to those skilled in the art to which it pertains by the following, more detailed description of the present invention.

BRIEF DESCRIPTION OF THE FIGURES is a top perspective view of the present invention, with certain parts broken away.

DESCRIPTION OF THE PREFERRED EMBODIMENTS

Figure 1:
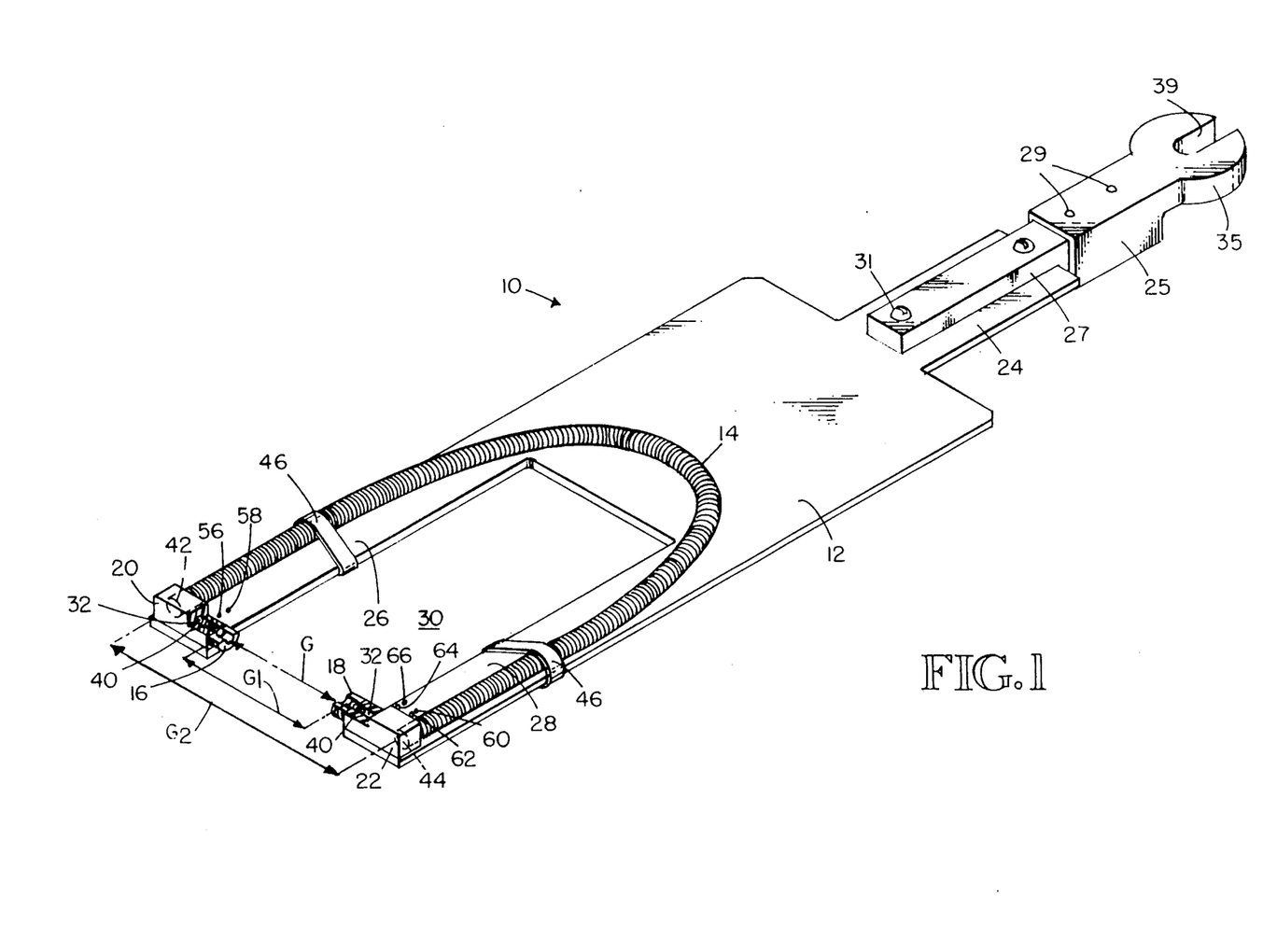

Referring now to FIG. 1, the AC current sensor of the present invention is shown generally designated at 10. AC current sensor 10 comprises a skeleton board 12, a main coil 14, upper and lower compensating coils 16, 18; upper and lower coil mounting blocks 20, 22; universal chuck adapter 25; and related electrical components which will be described in more detail below.

Skeleton board 12 is preferably a printed circuit board having an ear 24, and having upper and lower arms 26, 28 between which is defined a measuring recess 30. The two main functions of skeleton board 12 are to help maintain a precise geometrical relationship between the main coils' ends 42, 44 and the compensating coils 16, 18; and to provide some of the circuitry required for the AC current sensor 10. Thus, although it is preferred that skeleton board 12 be a printed circuit board for economy, compactness and ease of construction, it could be any other strong, rigid supporting means. If some other supporting means were used instead of a printed circuit board, then the circuitry carried by skeleton board 12 could be provided by any other conventional circuitry means, such as by wires or by a separate printed circuit board. The minimum height of the skeleton board's measuring recess 30, as measured between its arms 26, 28, is determined by the size of the largest AC current carrying conductor that a particular AC current sensor 10 is designed to measure, since the AC current carrying conductor is located within the skeleton board's measuring recess 30 while the measurement is made. The minimum length of the skeleton board's measuring recess 30, as measured between gap G and the closed end of the skeleton board's measuring recess 30, is determined by the minimum distance that the AC current carrying conductor to be measured must be spaced from the AC current sensor's gap G in order to obtain the desired degree of measurement accuracy.

Figures 2, 4:
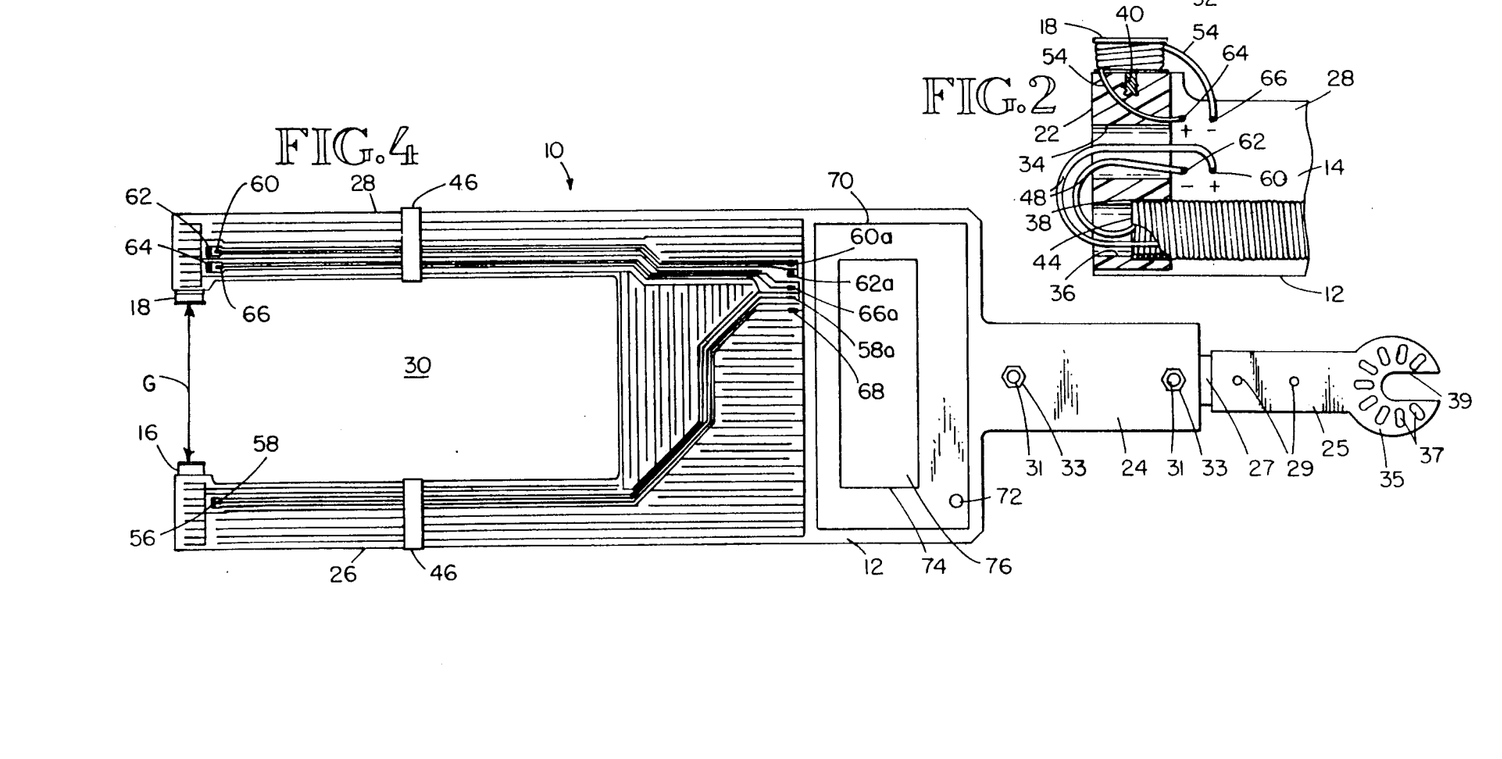
FIG. 2 is an enlarged fragmentary view of one portion of the present invention, with certain parts broken away.
FIG. 4 is a bottom elevational view of the present invention.

As seen in FIGS. 1 and 4, a universal chuck adapter 25 is secured to the skeleton board's ear 24 by any conventional means, such as by riveting it to a link 27 with a pair of rivets 29, and then securing link 27 to the skeleton board's ear 24 by pairs of screws 31, nuts 33 and lock washers (not illustrated). Universal chuck adapter 25 is of conventional design and has a bore (not illustrated) into which one end of link 27 is inserted before being riveted into place with rivets 29. The universal chuck adapter's circular end 35 has a plurality of positioning lugs 37 (nine being illustrated in FIG. 4), and a locking slot 39.

The universal chuck adapter 25 permits AC current sensor 10 to be secured to the universal chuck adapter on any other tool, such as a power company linesman's insulated hot stick. This is done in the conventional way by first assembling the tool and the AC current sensor 10 so that the positioning lugs 37 on their universal chuck adapters 25 mesh with each other. The universal chuck adapters 25 are then secured to each other in the conventional way by a bolt (not illustrated) which passes through their locking slots 39, and by a wing nut (not illustrated) which is screwed to the bolt. The universal chuck adapters' positioning lugs 37 permit the tool and the AC current sensor 10 to be selectively secured at various angles with respect to each other. If AC current sensor 10 was not intended to be mounted to the universal chuck adapter on another tool, then universal chuck adapter 25, link 27, rivets 29, screws 31, nuts 33, lock washers (not illustrated), and the skeleton board's ear 24 could be eliminated. Alternatively, any other conventional adapter means could be used instead of universal chuck adapter 25 to releasably or permanently secure AC current sensor 10 to another object.

Referring again to FIG. 1, coil mounting blocks 20, 22 are preferably made from any insulating material, such as plastic, and are secured, respectively, to the ends of the skeleton board's upper and lower arms 26, 28 by any conventional means, such as by gluing. Each coil block 20, 22 has a threaded bore 32 in one of its ends. In addition, as best seen in FIG. 2, each coil block 20, 22 has a central transverse bore 34, and has an end transverse bore 36 having an internal locating step 38. It is preferred, for economy, that coil mounting blocks 20, 22 be identical, even though the upper coil block's central transverse bore 34 is not utilized.

Upper and lower compensating coils 16, 18 are secured, respectively, to upper and lower coil blocks 20, 22 by mounting screws 40 which are screwed into the coil blocks' threaded bores 32. Mounting screws 40 are preferably made from an insulating material such as nylon or any other tough, suitable plastic.

Figure 3:
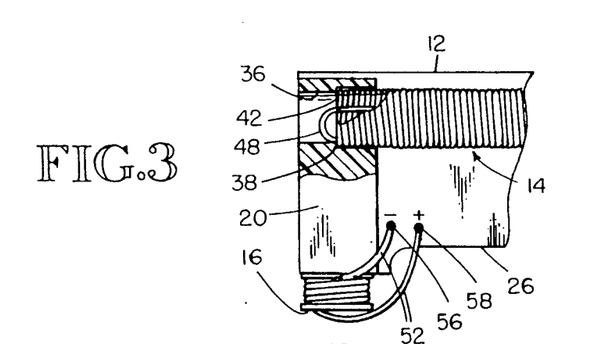
FIG. 3 is an enlarged fragmentary view of another portion of the present invention, with certain parts broken away.

As seen in FIGS. 2 and 3, main coil 14 is secured to skeleton board 12 by first inserting its upper and lower ends 42, 44, respectively, into the upper and lower coil blocks' end transverse bores 36, until the main coil's ends 42, 44 are in contact with the end transverse bores' locating steps 38. Referring now to FIG. 1, main coil 14 is then further secured to the skeleton board's upper and lower arms 26, 28 by a pair of ties 46 which are preferably made of an insulating material. Ties 46 may each comprise several turns of electrical tape.

Upper and lower coil mounting blocks 20, 22, main coil 14 and compensating coils 16, 18 are preferably located and arranged such that the longitudinal axes of compensating coils 16, 18 lie along an imaginary straight line which extends between the centers of the main coil's upper and lower ends 42, 44. The centers of the main coil's ends 42, 44 are spaced apart from each other along said imaginary straight line an accurately fixed distance $G_2$ apart.

The electrical centers of compensating coils 16, 18 are preferably located so that they are the same distance from the centers of their respective main coil's ends 42, 44. The electrical centers of compensating coils 16, 18 are also preferably spaced apart from each other along said imaginary line an accurately fixed distance $G_1$ apart. The electrical center of each compensating coil 16, 18 is the point on the longitudinal axis of its winding which is midway between the opposite ends of its winding.

If the longitudinal axes of compensating coils 16, 18 do not lie along an imaginary straight line which extends between the centers of the main coil's ends 42, 44; and/or if their electrical centers do not lie equal distances from the centers of the main coils ends 42, 44; then the AC current sensor 10 will, in general, still work. However, it would be more susceptible to the kinds of errors which are discussed below regarding when the ratio of $G_2$ to $G_1$ is not equal to the square root of three, with the acceptable deviations being determined by how accurate and how small a given AC current sensor 10 is desired to be.

Gap G is the distance between the facing ends of compensating coils 16, 18. However, it is preferred that compensating coils 16, 18; main coil 14; ties 46; coil blocks 20, 22; and skeleton board 12 be covered with a layer of conventional protective and/or insulating material. The thickness and type of insulating and/or protective material is selected to obtain the desired maximum voltage insulating capability between the AC current sensor 10 and the voltage carried by the sensed AC current carrying conductor. If such protective and/or insulating material is used, then gap G would be the distance between such layers of protective and/or insulating material on the facing ends of compensating coils 16, 18. Gap G is selected so that the largest size AC current carrying conductor to be measured by the AC current sensor 10 will fit through it.

For simplicity, reduced cost and ease of construction it is preferred that main coil 14 be a long solenoidal coil which is wound with a single layer of windings of wire 48, and which has an air core. As used herein, the term "air core" means, in general, any non-magnetic and/or non-metallic core, such as a core which is a vacuum, air, plastic, wood, and/or glass, etc.

The measurement made by the AC current sensor 10 will, to some extent, vary with where the sensed AC current carrying conductor is located within the skeleton board's measuring recess 30, even if the current being carried by the sensed conductor remains constant. In order to make the output of the AC current sensor 10 be as independent as possible of where the sensed AC current carrying conductor is located within the skeleton board's measuring recess 30, it is preferred that main coil 14 be wound so that the mean turn area ($A_m$) of wire 48 and the number of turns of wire 48 per unit length ($n_m$) are uniform along the entire length of main coil 14. A turn area is the area which is defined by one complete turn of a wire wound on a coil, when the area enclosed by the turn is viewed in elevation. The mean turn area ($A_m$) of a wire wound on a coil is the mean of the wire's turn areas. If the wire on a coil of uniform cross section is wound so that it has only one layer, then the wire's mean turn area ($A_m$) is equal to the wire's turn area. Although, as mentioned above, it is preferred that main coil 14 be wound with a single layer of windings of wire 48, it could be wound with multiple layers of wire 48 as long as the turn area and number of turns per unit length for each layer are uniform along the entire length of main coil 14.

The most accurate measurements can be made by the AC current sensor 10 if it is provided with positioning means which will help to accurately position the center of the calibration AC current carrying conductor (calibration will be discussed in detail below) and the center of the sensed AC current carrying conductor in the same location within the skeleton board's measuring recess 30. This will be true even if the mean turn area ($A_m$) of wire 48 and the number of turns of wire 48 per unit length ($n_m$) are not uniform along the entire length of main coil 14.

Such positioning means could comprise, for example, one and/or two axis alignment indicia on skeleton board 12, such as horizontal and/or vertical alignment lines on skeleton board 12. The center of any AC current carrying conductor would be accurately positioned in the desired location within the skeleton board's measuring recess 30 when it was at the imaginary intersection of the extension(s) of the alignment indicia. If the AC current sensor 10 were coated with a layer of protective and/or insulating material as was described above, then such alignment indicia could be located on such protective and/or insulating material, rather than directly on skeleton board 12.

Such positioning means could also comprise, for example, one or more templates sized to be inserted and held, as by a friction fit, within the skeleton board's measuring recess 30. Each such template would define a slot which was sized to receive up to a particular maximum size of AC current carrying conductor. The open end of the slot would communicate with gap G. The closed end of the slot would located so that the center of the AC current carrying conductor would be in the desired location within the skeleton board's measuring recess 30 when the AC current carrying conductor was of said particular maximum size and was positioned against the closed end of the slot. Any particular such template could be used with AC current carrying conductors whose sizes were smaller than said particular maximum size, particularly if the AC current sensor 10 and/or the template was provided with positioning means such as the alignment indicia which were described above.

The precise length of main coil 14 is relatively unimportant. It must, of course, be long enough to extend around, without entering, the skeleton board's measuring recess 30; but it must not be so long that it would interfere with the desired compactness of AC current sensor 10. In addition, main coil 14 must not be so short that it would be forced to bend so sharply around the skeleton board's measuring recess 30 that the desired uniformity of wire 48's mean turn area ($A_m$) or the desired uniformity of the number of turns of wire 48 per unit length ($n_m$) would be appreciably interfered with. For example, if main coil 14 were made by winding its wire 48 on a length of straight, flexible plastic tubing prior to main coil 14 being bent into the desired shape, then, as a rule of thumb, the minimum radius of curvature of main coil 14's bends should be no more than about 8 times main coil 14's diameter, in order to avoid having turns of wire 14 pop out of place when main coil 14 is bent.

If, for any given main coil 14, it is found that its bends are so sharp that there is an undesirable interference with the desired uniformity of wire 48's mean turn area ($A_m$), or with the desired uniformity of the number of turns of wire 48 per unit length ($n_m$), then main coil 14 could be made longer and/or wire 48's mean turn area ($A_m$) could be made smaller. In general, the smaller the mean turn area ($A_m$) of wire 48, the more sharply main coil 14 can be bent without appreciably interfering with the desired uniformity of wire 48's mean turn area ($A_m$), or with the desired uniformity of the number of turns of wire 48 per unit length ($n_m$).

The turn area of main coil 14 per unit length ($A_m$ times $n_m$) must be large enough so that adequate inductive pickup from the AC current carrying conductor is provided over the desired current range(s) which the AC current sensor 10 is designed to measure. As a rule of thumb, the required minimum turn area per unit length for main coil 14 is that which provides a signal, from the smallest current to be measured, which is substantially greater than the inherent noise voltage of the AC current sensor 10's amplifier. If the turn area of main coil 14 per unit length is too small to provide adequate inductive pickup, then $A_m$ and/or $n_m$ can be increased as necessary.

It is preferred that the diameter of the turns of wire 48 be small as compared to the shortest distance between main coil 14 and the conductor whose current is being measured. As a rule of thumb, the diameter of the turns of wire 48 should be no greater than about ½ of the shortest distance between main coil 14 and the conductor whose current is being measured. However, if main coil 14 is wound so that $A_m$ and $n_m$ are uniform along its entire length, then the diameter of the turns of wire 48 can be larger than ½ of the shortest distance between main coil 14 and the conductor whose AC current is being measured.

It is preferred that compensating coils 16, 18 be relatively short in axial length, in order to help minimize the size of AC current sensor 10. To this end, the compensating coils' wires 52, 54 are preferably wound in multiple layers. It is also preferred that compensating coils 16, 18 be identical air core coils whose wires 52, 54 each have a mean turn area ($A_c$) which is approximately the same as the mean turn area ($A_m$) of wire 50 of main coil 14.

As is known, air core coils having mean turn areas and a number of turns per unit length which are uniform along the entire length of the coils are conventional.

It is conventional knowledge that if a closed coil, such as a toroidal coil, has its wire wound so that the wire's mean turn area and number of turns per unit length are uniform along the entire length of the coil, then the voltage induced in the coil by an AC current carrying conductor which is located within the open space surrounded by the closed coil will have a number of interesting properties. Among those properties are that the induced voltage in the coil will be directly proportional to the current carried by the AC current carrying conductor; will be independent of the shape of the closed coil; and will be independent of the location and orientation of the AC current carrying conductor within the open space surrounded by the closed coil.

In order to compensate for the gap $G_2$ between the centers of the main coils' ends 42, 44, it is preferred that the compensating coils 16, 18 be wound so that their total area of turns compensates for the total area of turns the missing section of main coil 14 would have had if main coil 14 had extended across gap G2.

That is, ideally:

$$2N_c \cdot A_c = G_2 \cdot n_m \cdot A_m$$

where compensating coils 16, 18 are identical; where $N_c$ equals the number of turns wound on each compensating coil 16, 18; where $A_c$ equals the mean turn area for each compensating coil 16, 18; where $A_c$ and the number of turns per unit length are uniform along the entire lengths of compensating coils 16, 18; where $G_2$ is the distance between the centers of the main coil's ends 42, 44; where $n_m$ is the number of turns per unit length on main coil 14; where $A_m$ is the mean turn area of the wire wound on main coil 14; and where $n_m$ and $A_m$ are uniform along the entire length of main coil 14. It is preferred that $A_c$ be approximately the same as $A_m$.

However, the compensation provided by compensating coils 16, 18 is not perfect, since there is always a difference between the inductive pickup provided by compensating coils 16, 18 and the inductive pickup which would have been provided by the missing section of main coil 14 if main coil 14 had extended across gap G2. This difference will be called the "compensating error". The compensating error decreases as the spacing between gap $G_1$ and the AC current carrying conductor being measured increases, with such spacing being measured as the shortest distance between gap $G_1$ and the portion of the AC current carrying conductor which is located within the skeleton board's measuring recess 30. In addition, the voltage induced in coils 14, 16 and 18 by an AC current carrying conductor which is located outside of the AC current sensor 10 generally decreases (external signal rejection) as the spacing between gap $G_1$ and the AC current carrying conductor being measured increases, with such spacing being measured as the shortest distance between gap $G_1$ and the AC current carrying conductor.

It is preferred that $G_2$ and $G_1$ be selected such that the ratio of $G_2$ to $G_1$ equals the square root of three (1.732). This is because, in general, the compensating error decreases most rapidly with distance from $G_1$ (and the external signal rejection increases most rapidly with distance from $G_1$) when the ratio of $G_2$ to $G_1$ has this value. Thus, when the ratio of $G_2$ to $G_1$ has this value, the size of the AC current sensor 10 can be minimized for any particular desired degree of measurement accuracy. In addition, the external signal rejection of the AC current sensor increases most quickly with distance from gap $G_1$ when the ratio of $G_2$ to $G_1$ has this value.

For example, when main coil 14 and the compensating coils 16, 18 are properly aligned in the manner described above, and when the ratio of $G_2$ to $G_1$ is equal to 1.732 ±0.05, the compensating error is reduced to about 0.1% when the AC current carrying conductor being measured within the skeleton board's measuring recess 30 is located about 1.5 times $G_1$ from gap $G_1$, and is reduced to less than about 10 parts per million when the AC current carrying conductor being measured is located more than about 5 times $G_1$ from gap $G_1$. On the other hand, if the ratio of $G_2$ to $G_1$ were selected to be about 2.3, then the AC current carrying conductor would have to be located about 3.993 times $G_1$ from gap $G_1$ for a 0.1% compensating error, and would have to be located about 19.09 times $G_1$ from gap $G_1$ for a compensating error of less than about 10 parts per million.

Similarly, when main coil 14 and the compensating coils 16, 18 are properly aligned in the manner described above, and when the ratio of $G_2$ to $G_1$ is equal to 1.732 ±0.05, about 99.9% of an external signal is rejected when the external AC current carrying conductor being measured is located about 1.5 times $G_1$ outside of gap $G_1$, and all but about 10 parts per million of the external signal is rejected when the external AC current carrying conductor being measured is located more than about 5 times $G_1$ outside of gap $G_1$. On the other hand, if the ratio of $G_2$ to $G_1$ were selected to be about 2.3, then the external AC current carrying conductor would have to be located about 3.993 times $G_1$ outside of gap $G_1$ for a 99.9% external signal rejection, and would have to be located about 19.09 times $G_1$ outside of gap $G_1$ for all but about 10 parts per million of the external conductor's signal to be rejected.

The above examples were arrived at by theoretical mathematical calculations and approximations.

As was described above, it is preferred that the ratio of $G_2$ to $G_1$ be equal to about the square root of 3. However, the ratio of $G_2$ to $G_1$ can be in the range of from about 1.1 to 10.0, or greater; and is preferably in the range of from about 1.1 to about 3.0. The particular ratio of $G_2$ to $G_1$ is selected based on the desired degree of measurement accuracy, on the desired degree of external signal rejection, and/or on the desired maximum size of the AC current sensor 10. Once the desired degree of measurement accuracy, the desired degree of external signal rejection, and/or the desired maximum size of the AC current sensor 10 have been selected, the optimum ratio of $G_2$ to $G_1$ can be determined by conventional mathematical approximations or can be determined empirically by using conventional experimental techniques.

As seen in FIG. 3, the ends of the upper compensating coil's wire 52 are connected to terminals 56, 58. The portions of the upper compensating coils wire 52 which are not wound on the upper compensating coil 16 are preferably twisted about each other (not illustrated) before being connected to terminals 56, 58 in order to minimize stray pickup by said portions of wire 52. Similarly, one end of the main coil's wire 48 is preferably passed back through the hollow center of main coil 14 in order to minimize stray pickup by it.

As seen in FIG. 2, the end of wire 48 which was passed back through the hollow center of main coil 14 emerges and is connected to terminal 60, while the other end of wire 48 is connected to terminal 62. The portions of wire 48 which emerge from main coil end 44 are preferably twisted about each other prior to being connected to terminals 60, 62 in order to minimize stray pickup by them.

As seen in FIG. 3, the ends the lower compensating coil's wire 54 are connected to terminals 64, 66. The portions of the lower compensating coil's wire 54 which are not wound on the lower compensating coil 18 are preferably twisted about each other (not illustrated) before being connected to terminals 64, 66 in order to minimize stray pickup by said portions of wire 54.

Terminals 56, 58, 60, 62, 64 and 66 are through-the-board terminals which also emerge on the other side of skeleton board 12, as seen in FIG. 4. Terminals 56 and 64 are connected in series with each other by printed circuitry, as seen, since compensating coils 16, 18 are connected in series. Terminals 58, 60, 62, and 66 are connected, respectively, by printed circuitry to terminals 58a, 60a, 62a, and 66a. Terminals 58, 58a, 60, 60a and 64 are positive; while terminals 56, 62, 62a, 66 and 66a are negative.

In order to minimize stray pickup by the printed circuitry which extends between terminal pair 60, 60a, the printed circuitry which extends between terminal pair 62, 62a is split, as seen, into two parts which surround the printed circuitry which extends between terminal pair 60, 60a. For the same reason, the printed circuitry which extends between terminal pair 56, 64 is split, as seen, into two parts which surround the printed circuitry which extends between terminal pairs 66, 66a and 58, 58a. Additional shielding from stray pickup is provided by a shielding network of open ended printed circuitry lines which are all connected to terminal 68. The exact form of the shielding network is relatively unimportant, as long as thorough shielding is provided.

A shielding network of the nature which has been described above could be extended under electrical circuitry box 70. Electrical circuitry box 70 has an on/-off switch 72 and contains, in general, all of the electrical circuitry and electrical components which were not previously described, and is mounted to skeleton board 12 by any conventional means, such as by gluing. A conventional digital meter 74 is mounted in the top portion of circuitry box 70. Once the AC current sensor 10 is calibrated, the measured AC current can be read directly from meter readout 76.

Figure 5:
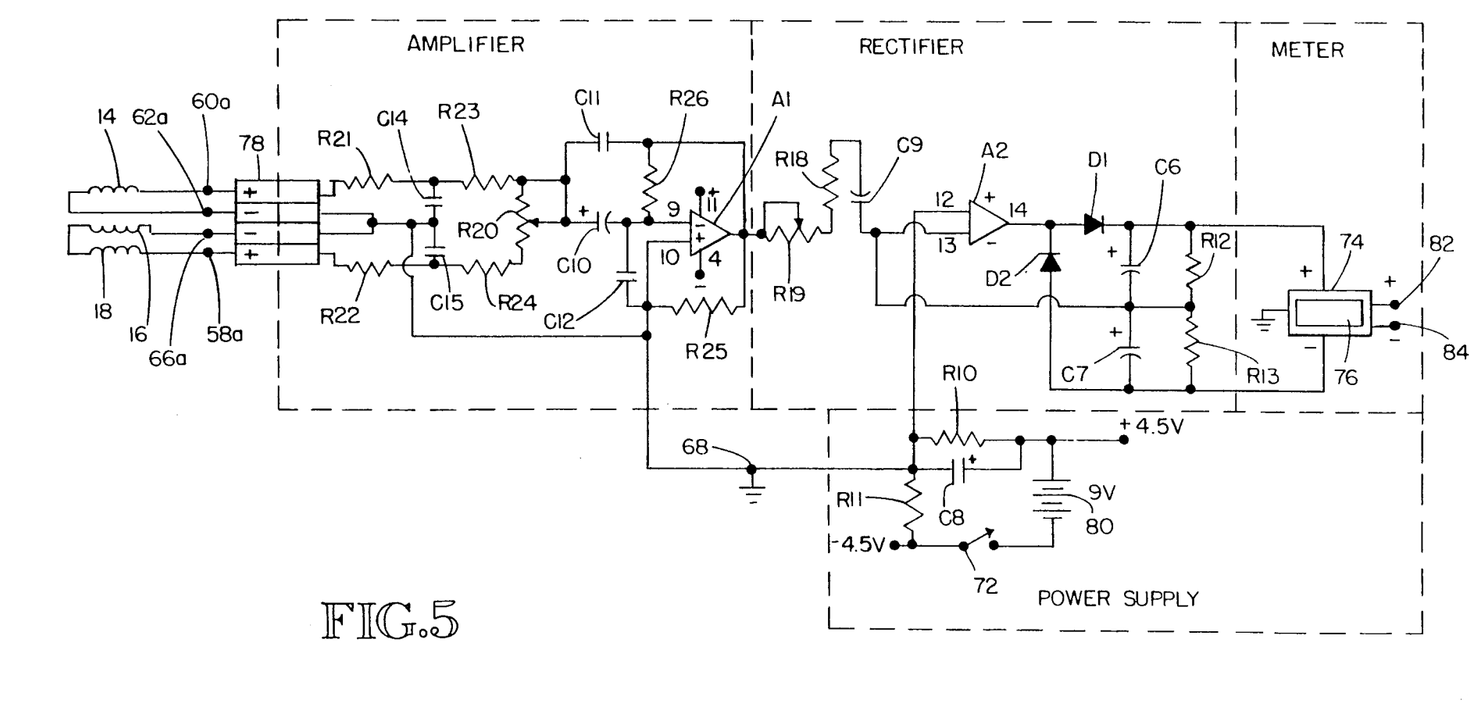
FIG. 5 is an electrical schematic for the present invention.

Referring now to FIG. 5, an electrical schematic for the AC current sensor 10 is illustrated. The schematic is for an AC current sensor 10 which will measure AC currents from zero to 2,000 amps at signal frequencies of from 50 to 1000 Hz, with an error of less than about one or two percent.

Main coil 14 has a single layer winding which is a total of 16.5 inches long, which has 90 turns per inch, and which is wound with number 30 AWG (American Wire Gauge), double build (double insulated), magnet wire 48. Wire 48 is wound on a 0.25 inch diameter form with a mean turn area ($A_m$) equal to 0.053 square inches. Each compensating coil 16, 18 has a winding which is 0.125 inches long and which has a total of 170 turns of number 36 AWG double build magnet wire 52, 54, respectively. Because of the short length of the windings on compensating coils 16, 18, their wires 52, 54 are wound in about 6.3 layers, with each layer having about 27 turns. The diameter of the innermost winding of wires 52, 54 is 0.189 inches.

G is equal to 2.000 inches, $G_1$ is equal to 2.287 inches; and $G_2$ is equal to 3.960 inches.

R10 is a 100K, ¼W, 5% resistor; R11 is a 150K, 1/4W, 5% resistor; R12 and R13 are 13.7K, ⅛W, 1% resistors; R18 is a 6.19K, ⅛W, 1% resistor; R19 and R20 are 2K single turn pots; R21 and R22 are 100 ohm ¼W, 5% resistors; R23 is a 9.53K, ⅛W, 1% resistor; R24 is a 8.66K, ⅛W, 1% resistor; R25 is a 1 meg, ¼W, 5% resistor; and R26 is a 750K, 1/4W, 5% resistor.

C6, C7 and C10 are 3.3 microfarad, 16V, 10% capacitors; C8 and C9 are 2.2 microfarad, 16V, 10% capacitors; C11 is a 0.022 microfarad, 75VDC, 2% capacitor; C12 is a 100 picofarad, 5% capacitor; and C14 and C15 are 0.1 microfarad capacitors.

D1 and D2 are type 1N4148 diodes. Digital meter 74 is a model number BL100102 digital panel meter made by Modutec of Norwalk, Conn. The meter's positive and negative power terminals 82, 84 are connected, respectively, to the terminals marked plus 4.5V and minus 4.5V. Reference numeral 78 is a conventional plug and jack connector having at least four pins.

A1 and A2 are two of the four very high gain, low power operational amplifiers in a CMOS quad operational amplifier, part number TLC27L4CN made by Texas Instruments, Inc., of Dallas, Texas. The pin numbers for the operational amplifiers are set forth in FIG. 5. Pin numbers 4 and 11 of operational amplifier A1 are connected, respectively, to the terminals marked minus 4.5V and plus 4.5V.

R21 and C14, along with the self inductance of main coil 14, form a radio frequency filter for amplifier A1's input for main coil 14. Similarly, R22 and C15, along with the self inductances of compensating coils 16, 18, form a radio frequency filter for amplifier A1's input for compensating coils 16, 18. Both radio frequency filters serve to keep strong AM radio broadcast signals picked up by coils 14, 16, 18 out of amplifier A1.

R23 is the gain setting resistor for amplifier A1 for main coil 14; and R20 and R24 are the gain setting resistors for amplifier A1 for compensating coils 16, 18. R20 is adjustable to allow the overall gain of amplifier A1 for compensating coils 16, 18 to be matched to the overall gain of amplifier A1 for main coil 14. This adjustment also corrects for manufacturing variations in coils 14, 16, 18; and corrects for when $N_c \cdot A_c$ does not equal $G_2 \cdot n_m \cdot A_m$.

C11 is amplifier A1's integrator capacitor. Since the inductive sensitivity of coils 14, 16 and 18 increases in direct proportion to the frequency of the current in the AC current carrying conductor which is being measured by the AC current sensor 10 (a derivative characteristic), the gain of amplifier A1 preferably varies in inverse proportion to such frequency (an integrator characteristic). This arrangement helps to make the output of amplifier A1 as linear as possible, and also enables the output voltage of amplifier A1 to accurately reproduce the waveform of the current in the sensed AC current carrying conductor. C11 gives amplifier A1 the required inverse frequency dependent gain since its reactance varies in inverse proportion to frequency. C11 is preferably chosen to be as non-temperature sensitive as possible in order to reduce temperature induced errors.

C12 reduces interference from VHF radio and television signals. R26 and C10 provide a DC feedback path for amplifier A1. R25 helps meter readout 76 to settle to zero sooner, by reducing transients, when power switch 72 is turned on.

R18 and R19, which form the rectifier's input resistance, determine the gain of amplifier A2, and thus the sensitivity and accuracy of the AC current sensor 10. R19 is adjustable for calibrating the AC current sensor 10. C9 is a DC blocking capacitor which makes the rectifier respond only to the AC component of amplifier A1.

The rectifier circuit includes D1, D2, R12, R13, C6 and C7. Diode D1 permits the positive half cycles of the output of amplifier A2 to reach the positive input terminal of meter 74; while diode D2 permits the negative half cycles of the output of amplifier A2 to reach the negative input terminal of meter 74. Resistors R12 and R13 are rectifier load resistors which work with capacitors C6 and C7. Capacitors C6 and C7 smooth the output of the rectifier by averaging the rectified voltage.

Resistors R10 and R11 are voltage dividing resistors which divide the voltage of 9 V battery 80 into voltages of plus and minus 4.5 volts. C8 provides a low impedance AC path to ground. The grounds indicated in the schematic are signal ground.

Although the amplifier, rectifier, power supply and meter seen in FIG. 5 are preferably mounted to skeleton board 12 for compactness and convenience, they could be mounted at a remote location, with the signals from coils 14, 16 and 18 being transmitted to them by any conventional means.

The calibration of AC current sensor 10 will now be described. First, a conductor carrying a large AC current is located outside the AC current sensor 10 at a distance from gap $G_1$ which is equal to several times $G_1$. The conductor is preferably oriented at a right angle to the plane of skeleton board 12 on an imaginary line which lies in the plane of skeleton board 12, and which is perpendicular to an imaginary straight line extending between main coil 14's ends 42, 44. The conductor may, for example, carry an AC current of 200 amps and be located about five inches from gap $G_1$. Then R20 is adjusted for a zero reading on the meter.

Next, a conductor carrying an accurately known AC current is located inside the skeleton board's measuring recess 30, preferably at a minimum distance from gap $G_1$ of 1.5 times $G_1$. The orientation of the conductor with respect to the plane of skeleton board 12 is not important; but the conductor must not pass through the skeleton board's measuring recess 30 more than once. Lastly, R19 is adjusted until meter 74 gives a reading which is equal to the known AC current.

The amplifier, rectifier, meter and power supply shown in FIG. 5 are generally of conventional design, and there are numerous other conventional circuits which could be used to convert the output from main coil 14 and compensating coils 16, 18 into a readable or other usable form in view of the disclosures herein.

However, as was discussed above the amplifier does have several special features. One of them is that the gain of the amplifier decreases in inverse proportion to the frequency of the AC current in the sensed AC current carrying conductor over the frequency range of interest. This not only compensates for the fact that the inductive pickup of coils 14, 16 and 18 increase in direct proportion to said frequency; but also provides for accurate reproduction of the current waveform in the amplifier's output voltage. Another special feature of the amplifier is that the amplifier has one input for the signal from main coil 14; has another input for the series connected compensating coils 16, 18; and has means for adjusting the sensitivity of the amplifier regarding the two inputs in order to compensate for manufacturing variations in coils 14, 16, and/or 18, and in order to compensate for when $2N_c \cdot A_c$ does not equal $G_2 \cdot n_m \cdot A_m$.

To use AC current, sensor 10, it is first turned on with power switch 72, and then calibrated in the manner described above. Next, the conductor whose AC current is to be measured is passed through gap $G_1$ and positioned in the skeleton board's measuring recess 30 at a location which is preferably at least 1.5 times $G_1$ from gap $G_1$. As was described earlier, positioning means, such as alignment indicia may be provided for AC current sensor 10, to help the user to properly position the sensed AC current carrying conductor in the skeleton board's measuring recess 30. The orientation of the sensed AC current carrying conductor with respect to the plane of skeleton board 12 is not important; but the sensed AC current carrying conductor must not pass through the skeleton board's measuring recess 30 more than once. The AC current flowing in the sensed AC current carrying conductor can then be read directly from the digital meter's readout 76.

In view of the foregoing, these and further modifications, adaptations and variations of the present invention will now be apparent to those skilled in the art to which it pertains, within the scope of the following claims. It is understood that all of the foregoing forms of the invention were described and/or illustrated strictly by way of non-limiting example.

What is claimed is:

1. An AC current sensor for sensing an AC current in an AC current carrying conductor, wherein said AC current sensor comprises:

a main coil having a pair of main coil ends; wherein each of said main coil ends has a center; wherein a fixed main coil gap is defined between said centers of said main coil ends; wherein said main coil gap is sized to permit said AC current carrying conductor to pass therethrough; wherein said main coil is arranged to define a measuring recess; and wherein said measuring recess is sized to permit said AC current carrying conductor to pass therethrough;

a pair of compensating coils; and mounting means for holding said main coil ends and said compensating coils in a predetermined geometrical relationship with respect to each other;

wherein when said AC current carrying conductor is located in said main coil's measuring recess, said AC current induces voltages in said main coil and in said compensating coils as a function of said AC current; wherein each of said compensating coils has a compensating coil longitudinal axis; wherein each said compensating coil longitudinal axis lies at least generally on an imaginary straight line which extends between said centers of said main coil ends; wherein each said compensating coil has an end which at least generally faces an end of the other of said compensating coils; wherein a fixed conductor gap is defined between said facing ends of said compensating coils; and wherein said conductor gap is sized to permit said AC current carrying conductor to pass therethrough.

2. An AC current sensor for sensing an AC current in an AC current carrying conductor, wherein said AC current sensor comprises:

a main coil having a pair of main coil ends; wherein each of said main coil ends has a center; wherein a fixed main coil gap is defined between said centers of said main coil ends; wherein said main coil gap is sized to permit said AC current carrying conductor to pass therethrough; wherein said main coil is arranged to define a measuring recess; and wherein said measuring recess is sized to permit said AC current carrying conductor to pass therethrough;

a pair of compensating coils; and mounting means for holding said main coil ends and said compensating coils in a predetermined geometrical relationship with respect to each other;

wherein when said AC current carrying conductor is located in said main coil's measuring recess, said AC current induces voltages is said main coil and in said compensating coils as a function of said AC current; wherein each of said compensating coils has a compensating coil electrical center; wherein each said compensating coil electrical center lies at least generally on an imaginary straight line which extends between said centers of said main coil ends;

wherein each said compensating coil has an end which at least generally faces an end of the other of said compensating coils; wherein a fixed conductor gap is defined between said facing ends of said compensating coils; and wherein said conductor gap is sized to permit said AC current carrying conductor to pass therethrough.

3. The AC current sensor according to claim 2, wherein said compensating coil electrical centers are located at least generally the same distance from their respective main coil ends.

4. An AC current sensor for sensing an AC current in an AC current carrying conductor, wherein said AC current sensor comprises:
 a main coil having a pair of main coil ends; wherein each of said main coil ends has a center; wherein a fixed main coil gap is defined between said centers of said main coil ends; wherein said main coil gap is sized to permit said AC current carrying conductor to pass therethrough; wherein said main coil is arranged to define a measuring recess; and wherein said measuring recess is sized to permit said AC current carrying conductor to pass therethrough;
 a pair of compensating coils; and
 mounting means for holding said main coil ends and said compensating coils in a predetermined geometrical relationship with respect to each other;
 wherein when said AC current carrying conductor is located in said main coil's measuring recess, said AC current induces voltages in said main coil and in said compensating coils as a function of said AC current; wherein each of said compensating coils has a compensating coil longitudinal axis and has a compensating coil electrical center; wherein each said compensating coil longitudinal axis and each said compensating coil electrical center lies at least generally on an imaginary straight line which extends between said centers of said main coil ends; wherein said compensating coil electrical centers are located at least generally the same distance from their respective main coil ends; wherein each said compensating coil has an end which at least generally faces an end of the other of said compensating coils; wherein a fixed conductor gap is defined between said facing ends of said compensating coils; wherein said conductor gap is sized to permit said AC current carrying conductor to pass therethrough; and wherein a fixed compensating coil gap is defined between said compensating coil electrical centers.

5. The AC current sensor according to claim 4, wherein the ratio of said main coil gap to said compensating coil gap falls at least generally in the range of from about 1.1 to about 10.0.

6. The AC current sensor according to claim 4, wherein the ratio of said main coil gap to said compensating coil gap falls at least generally in the range of from about 1.1 to about 3.0.

7. The AC current sensor according to claim 4, wherein the ratio of said main coil gap to said compensating coil gap is equal to about the square root of 3.

8. An AC current sensor for sensing an AC current in an AC current carrying conductor, wherein said AC current sensor comprises:
 a main coil having a pair of main coil ends; wherein each of said main coil ends has a center; wherein a fixed main coil gap is defined between said centers of said main coil ends; wherein said main coil gap is sized to permit said AC current carrying conductor to pass therethrough; wherein said main coil is arranged to define a measuring recess; and wherein said measuring recess is sized to permit said AC current carrying conductor to pass therethrough;
 a pair of compensating coils; and
 mounting means for holding said main coil ends and said compensating coils in a predetermined geometrical relationship with respect to each other;
 wherein when said AC current carrying conductor is located in said main coil's measuring recess, said AC current induces voltages in said main coil and in said compensating coils as a function of said AC current; and wherein said main coil and said compensating coils are electrically connected in series with each other.

9. An AC current sensor for sensing an AC current in an AC current carrying conductor, wherein said AC current sensor comprises:
 a main coil having a pair of main coil ends; wherein each of said main coil ends has a center; wherein a fixed main coil gap is defined between said centers of said main coil ends; wherein said main coil gap is sized to permit said AC current carrying conductor to pass therethrough; wherein said main coil is arranged to define a measuring recess; and wherein said measuring recess is sized to permit said AC current carrying conductor to pass therethrough;
 a pair of compensating coils; and
 mounting means for holding said main coil ends and said compensating coils in a predetermined geometrical relationship with respect to each other;
 wherein when said AC current carrying conductor is located in said main coil's measuring recess, said AC current induces voltages in said main coil and in said compensating coils as a function of said AC current; wherein said main coil is wound with a main coil wire; wherein each said compensating coil is wound with a respective compensating coil wire; wherein said main coil has a main coil missing portion equal in length to said main coil gap; wherein the sum of the total area of turns of said compensating coil wires is at least generally equal to the total area of turns of said main coil wire said main coil missing portion would have had if said main coil had extended across said main coil gap.

10. The AC current sensor according to claim 1, wherein said compensating coils are electrically connected in series with each other.

11. The AC current sensor according to claim 2, wherein said compensating coils are electrically connected in series with each other.

12. The AC current sensor according to claim 3, wherein said compensating coils are electrically connected in series with each other.

13. The AC current sensor according to claim 4, wherein said compensating coils are electrically connected in series with each other.

14. The AC current sensor according to claim 5, wherein said compensating coils are electrically connected in series with each other.

15. The AC current sensor according to claim 6, wherein said compensating coils are electrically connected in series with each other.

16. The AC current sensor according to claim 7, wherein said compensating coils are electrically connected in series with each other.

17. The AC current sensor according to claim 9, wherein said compensating coils are electrically connected in series with each other.

18. The AC current sensor according to claim 1, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said AC current carrying conductor.

19. The AC current sensor according to claim 2, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said AC current carrying conductor.

20. The AC current sensor according to claim 3, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said AC current carrying conductor.

21. The AC current sensor according to claim 4, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said AC current carrying conductor.

22. The AC current sensor according to claim 5, further comprising amplifier means for amplifying said voltages in said main coil and in said compensating coils to produce an output measuring voltage which is a function of said AC current in said AC current carrying conductor; wherein the gain of aid amplifier means varies in inverse proportion to the frequency of said AC current in said AC current carrying conductor, to help enable the voltage waveform of said output measuring voltage to be an accurate function of the current waveform of said AC current in said AC current carrying conductor.

23. The AC current sensor according to claim 6, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said AC current carrying conductor.

24. The AC current sensor according to claim 7, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said AC current carrying conductor.

25. The AC current sensor according to claim 8, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said AC current carrying conductor.

26. The AC current sensor according to claim 9, further comprising amplifier means for amplifying said voltages in said main coil and in said compensating coils to produce an output measuring voltage which is a function of said AC current in said AC current carrying conductor; wherein the gain of said amplifier means varies in inverse proportion to the frequency of said AC current in said AC current carrying conductor, to help enable the voltage waveform of said output measuring voltage to be an accurate function of the current waveform of said AC current in said Ac current carrying conductor.

27. The AC current sensor according to claim 1, further comprising amplifier means for amplifying said voltages in said main coil and in said compensating coils to produce an output measuring voltage which is a function of said AC current in said AC current carrying conductor; wherein said amplifier means further comprises compensating means for selectively adjusting the amount said voltages in said main coil and in said compensating coils are amplified by said amplifier means with respect to each other, to help enable said amplifier means to compensate for undesirable differences in said main coil and in said compensating coils.

28. The AC current sensor according to claim 2, further comprising amplifier means for amplifying said voltages in said main coil and in said compensating coils to produce an output measuring voltage which is a function of said AC current in said AC current carrying conductor; wherein said amplifier means further comprises compensating means for selectively adjusting the amount said voltages in said main coil and in said compensating coils are amplified by said amplifier means with respect to each other, to help enable said amplifier means to compensate for undesirable differences in said main coil and in said compensating coils.

29. The AC current sensor according to claim 3, further comprising amplifier means for amplifying said voltages in said main coil an din said compensating coils to produce an output measuring voltage which is a function of said AC current in said AC current carrying conductor; wherein said amplifier means further comprises compensating means for selectively adjusting the amount said voltages in said main coil and in said compensating coils are amplified by said amplifier means with respect to each other, to help enable said amplifier means to compensate for undesirable differences in said main coil and in said compensating coils.

30. The AC current sensor according to claim 4, further comprising amplifier means for amplifying said voltages in said main coil and in said compensating coils to produce an output measuring voltage which is a function of aid Ac current in said AC current carrying conductor; wherein said amplifier means further comprises compensating mans for selectively adjusting the amount said voltages in said main coil and in said compensating coils are amplified by said amplifier means with respect to each other, to help enable said amplifier means to compensate for undesirable differences in said main coil and in said compensating coils.

31. The AC current sensor according to claim 5, further comprising amplifier means for amplifying said voltages in said main coil and in said compensating coils to produce an output measuring voltage which is a function of said AC current in said AC current carrying conductor; wherein said amplifier means further comprises compensating means for selectively adjusting the amount said voltages in said main coil and in said compensating coils are amplified by said amplifier means with respect to each other, to help enable said amplifier means to compensate for undesirable differences in said main coil and in said compensating coils.

32. The AC current sensor according to claim 6, further comprising amplifier means for amplifying said voltages in said main coil and in said compensating coils to produce an output measuring voltage which is a function of said AC current in said AC current carrying conductor; wherein said amplifier means further comprises compensating mans for selectively adjusting the amount said voltages in said main coil and in said compensating coils are amplified by said amplifier means with respect to each other, to help enable said amplifier means to compensate for undesirable differences in said main coil and in said compensating coils.

33. The AC current sensor according to claim 7, further comprising amplifier means for amplifying said voltages in said main coil and in said compensating coils to produce an output measuring voltage which is a function of said AC current in said AC current carrying conductor; wherein said amplifier means further comprises compensating mans for selectively adjusting the amount said voltages in said main coil and in said compensating coils are amplified by said amplifier means with respect to each other, to help enable said amplifier means to compensate for undesirable differences in said main coil and in said compensating coils.

34. The AC current sensor according to claim 8, further comprising amplifier means for amplifying said voltages in said main coil and in said compensating coils to produce an output measuring voltage which is a function of said AC current in said AC current carrying conductor; wherein said amplifier means further comprises compensating mans for selectively adjusting the amount said voltages in said main coil and in said compensating coils are amplified by said amplifier means with respect to each other, to help enable said amplifier means to compensate for undesirable differences in said main coil and in said compensating coils.

35. The AC current sensor according to claim 9, further comprising amplifier means for amplifying said voltages in said main coil and in said compensating coils to produce an output measuring voltage which is a function of said AC current in said AC current carrying conductor; wherein said amplifier means further comprises compensating means for selectively adjusting the amount said voltages in said main coil and in said compensating coils are amplified by said amplifier means with respect to each other, to help enable said amplifier means to compensate for undesirable differences in said main coil and in said compensating coils.

* * * * *